United States Patent
Edelstein et al.

(10) Patent No.: US 8,492,289 B2
(45) Date of Patent: Jul. 23, 2013

(54) BARRIER LAYER FORMATION FOR METAL INTERCONNECTS THROUGH ENHANCED IMPURITY DIFFUSION

(75) Inventors: Daniel C. Edelstein, White Plains, NY (US); Takeshi Nogami, Schenectady, NY (US); Hosadurga K. Shobha, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 372 days.

(21) Appl. No.: 12/882,500

(22) Filed: Sep. 15, 2010

(65) Prior Publication Data
US 2012/0061838 A1     Mar. 15, 2012

(51) Int. Cl.
*H01L 21/31*     (2006.01)

(52) U.S. Cl.
USPC ............ 438/762; 438/765; 438/769; 438/770

(58) Field of Classification Search
USPC .................. 438/762, 765, 769, 770
See application file for complete search history.

(56) References Cited

U.S. PATENT DOCUMENTS

| | | | |
|---|---|---|---|
| 6,147,009 A | 11/2000 | Grill et al. | |
| 6,399,496 B1 | 6/2002 | Edelstein et al. | |
| 6,444,568 B1 | 9/2002 | Sundararajan et al. | |
| 6,873,057 B2 | 3/2005 | Chen et al. | |
| 6,936,535 B2 | 8/2005 | Kim et al. | |
| 7,052,932 B2 | 5/2006 | Huang et al. | |
| 7,071,094 B2 | 7/2006 | Lu et al. | |
| 7,205,666 B2 | 4/2007 | Lee et al. | |
| 7,247,946 B2 | 7/2007 | Bruley et al. | |
| 7,531,891 B2 | 5/2009 | Ohto et al. | |
| 8,102,051 B2 * | 1/2012 | Nakao | 257/751 |
| 2005/0218519 A1 * | 10/2005 | Koike et al. | 257/756 |
| 2008/0142974 A1 | 6/2008 | Arakawa | |
| 2009/0263965 A1 | 10/2009 | Gordon et al. | |

OTHER PUBLICATIONS

C.-C. Chiang et al., "Improvement in Leakage Current and Breakdown Field of Cu-Comb Capacitor Using a Silicon Oxycarbide Dielectric Barrier," J. Electrochem. Soc., 151, 2004, pp. G606-G611.
J. Iijima et al., "Selective Oxidation and Resistivity Reduction of Cu-Mn Alloy Films for Self-forming Barrier Process," Mater. Res. Soc. Symp. Proc., 1079-N03-09, Mar. 2008.

* cited by examiner

*Primary Examiner* — Jae Lee
(74) *Attorney, Agent, or Firm* — Cantor Colburn LLP; Katherine Brown

(57) ABSTRACT

A method of forming a barrier layer for metal interconnects of an integrated circuit device includes forming a first cap layer over a top surface of a conductive line of the integrated circuit device in a manner that facilitates a controllable dose of oxygen provided to the top surface of the conductive line, the conductive line comprising a metal formed over a seed layer that is an impurity alloy of the metal; and annealing the integrated circuit device so as to combine diffused impurity atoms of the seed layer with the controllable dose of oxygen, thereby forming an impurity oxide layer at an interface between the first cap layer and the top surface of the conductive line.

4 Claims, 5 Drawing Sheets

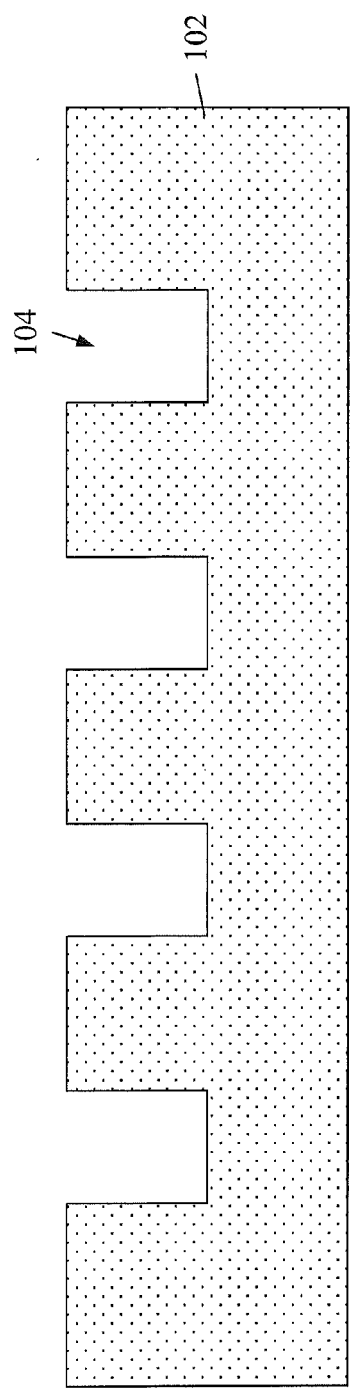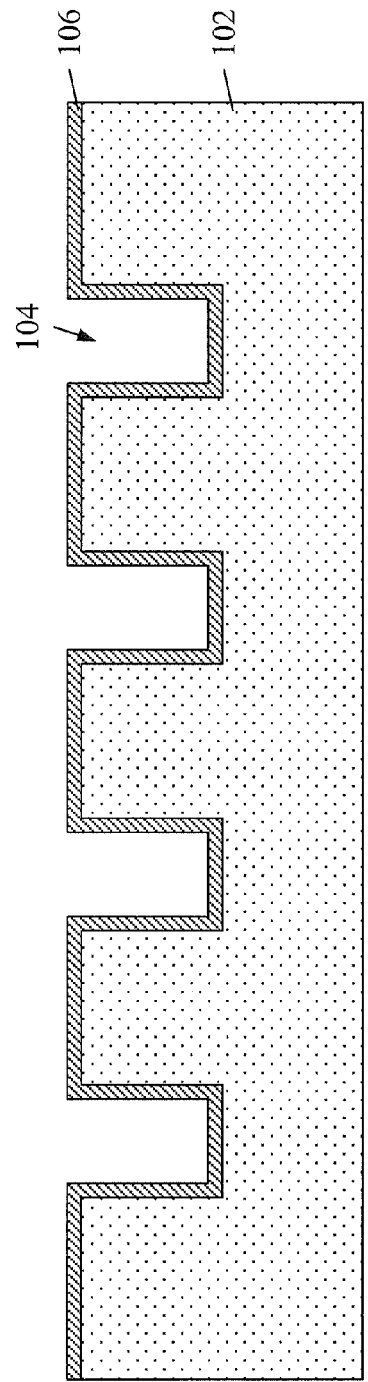
Figure 1(a)
Figure 1(b)

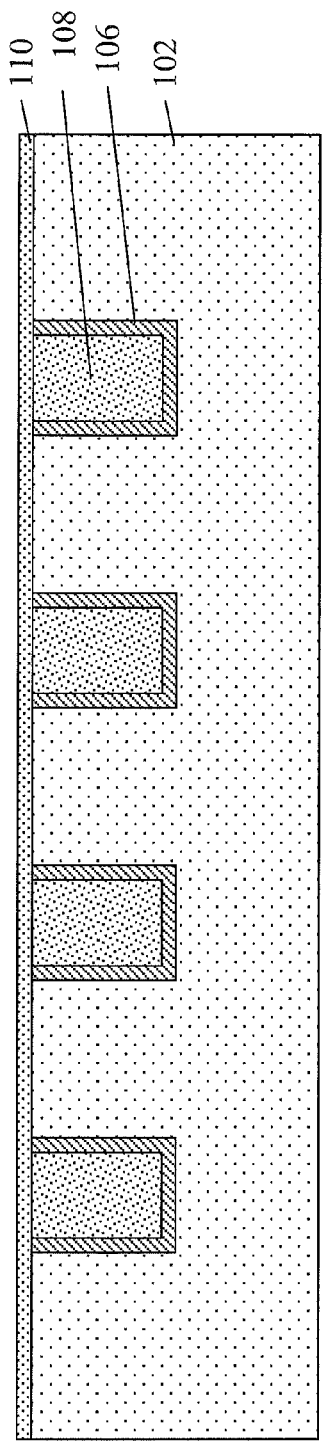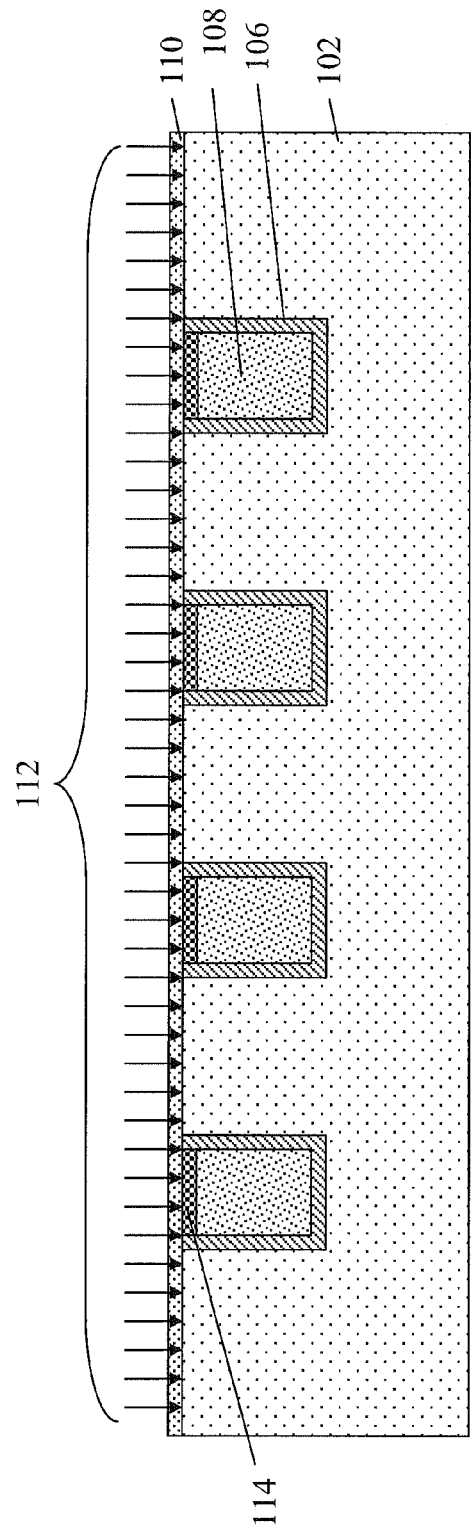

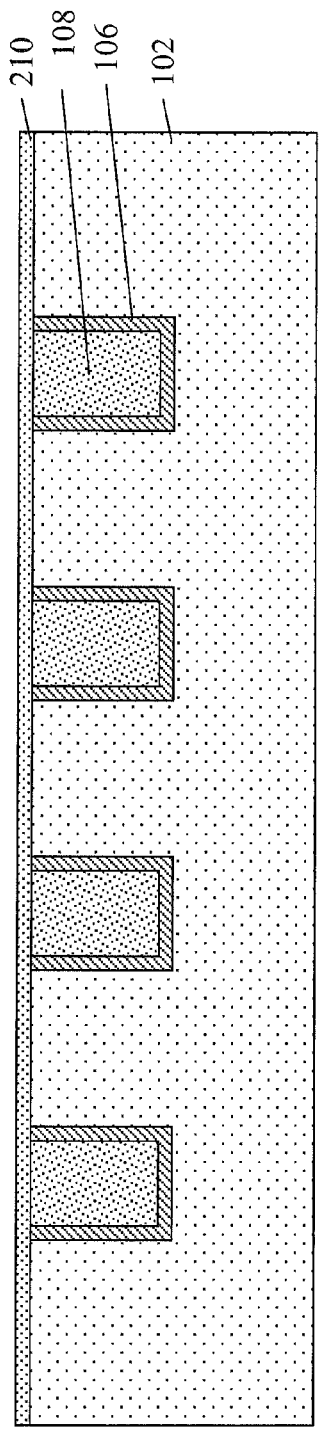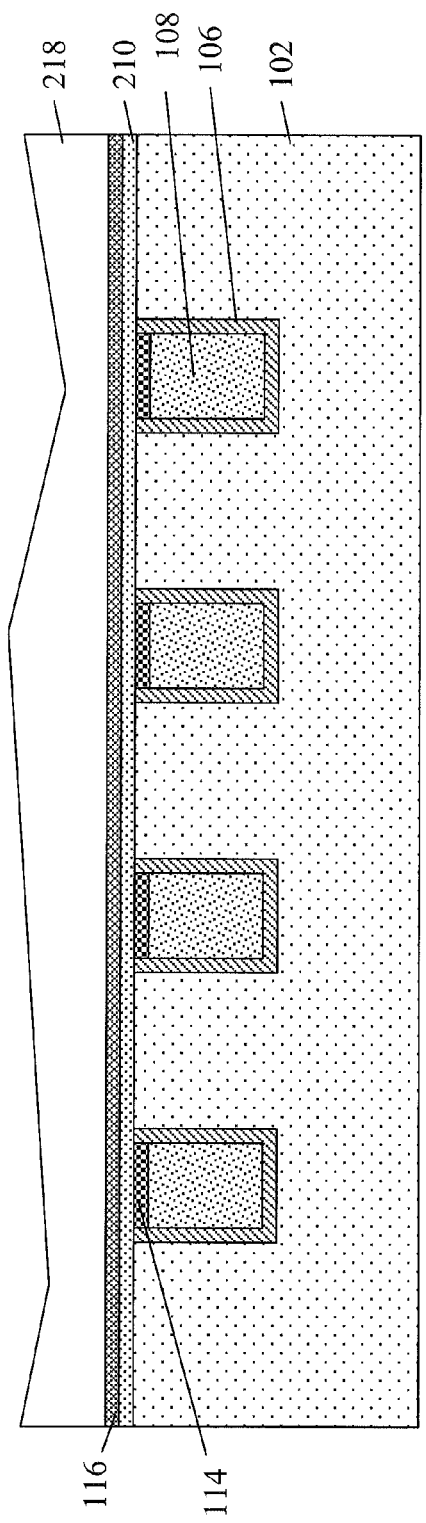
Figure 2(a)
Figure 2(b)

BARRIER LAYER FORMATION FOR METAL INTERCONNECTS THROUGH ENHANCED IMPURITY DIFFUSION

BACKGROUND

The present invention relates generally to semiconductor device manufacturing and, more particularly, to barrier layer formation for metal interconnects through enhanced impurity diffusion.

Integrated circuits are typically fabricated with multiple levels of patterned metallization lines, which are electrically separated from one another by interlayer dielectrics containing vias at selected locations, to provide electrical connections between levels of the patterned metallization lines. In recent years, copper (Cu) has replaced aluminum (Al) as the metal of choice for wiring of microelectronic devices, such as microprocessors and memories. However, copper has a tendency to diffuse through insulators, such as silicon dioxide, during high temperature processes. As a result, the use of copper wiring also necessitates the placement of efficient diffusion barriers surrounding the copper wires, thereby keeping the copper atoms confined to the intended wiring locations and preventing circuit malfunctions, such as shorts.

As these integrated circuits are scaled to smaller dimensions in a continual effort to provide increased density and performance (e.g., by increasing device speed and providing greater circuit functionality within a given area chip), the interconnect linewidth dimension becomes increasingly narrow, which in turn renders them more susceptible to other deleterious effects such as electromigration. Electromigration is a term referring to the phenomenon of mass transport of metallic atoms (such as copper) which make up the interconnect material, as a result of unidirectional or DC electrical current conduction therethrough. More specifically, the electron current collides with the diffusing copper atoms, thereby pushing them in the direction of current travel. Over an extended period of time, the accumulation of copper at the anode end of the interconnect material significantly increases the local mechanical stress in the system. Most of this unwanted motion takes place along the surface of the copper, and in turn may lead to delamination, cracking, and even metal extrusion from the copper wire, thereby causing an electrical short to adjacent interconnects.

SUMMARY

In an exemplary embodiment, a method of forming a barrier layer for metal interconnects of an integrated circuit device includes forming a first cap layer over a top surface of a conductive line of the integrated circuit device in a manner that facilitates a controllable dose of oxygen provided to the top surface of the conductive line, the conductive line comprising a metal formed over a seed layer that is an impurity alloy of the metal; and annealing the integrated circuit device so as to combine diffused impurity atoms of the seed layer with the controllable dose of oxygen, thereby forming an impurity oxide layer at an interface between the first cap layer and the top surface of the conductive line.

In another embodiment, a method of forming a barrier layer for metal interconnects of an integrated circuit device includes forming a conductive line in an insulating layer of the semiconductor device by forming a metal material over a seed layer that is an impurity alloy of the metal; forming a first cap layer over a top surface of the conductive line, the first cap layer comprising an oxygen permeable cap layer; annealing the integrated circuit device so as to combine diffused impurity atoms of the seed layer with the controllable dose of oxygen, thereby forming an impurity oxide layer at an interface between the first cap layer and the top surface of the conductive line; and forming a second cap layer over the first cap layer following the annealing, the second cap layer comprising an oxygen blocking cap layer.

In another embodiment, a method of forming a barrier layer for metal interconnects of an integrated circuit device includes forming a conductive line in an insulating layer of the semiconductor device by forming a metal material over a seed layer that is an impurity alloy of the metal; forming a first cap layer over a top surface of the conductive line, wherein oxygen is a constituent element of the first cap layer; forming a second cap layer over the first cap layer, the second cap layer comprising an oxygen blocking cap layer; and annealing the integrated circuit device so as to combine diffused impurity atoms of the seed layer with oxygen released by the first cap layer, thereby forming an impurity oxide layer at an interface between the first cap layer and the top surface of the conductive line.

In still another embodiment, a metal interconnect structure for an integrated circuit device includes a first cap layer formed over a top surface of a conductive line of the integrated circuit device to facilitate a controllable dose of oxygen provided to the top surface of the conductive line, the conductive line comprising a metal formed over a seed layer that is an impurity alloy of the metal; and an impurity oxide layer formed at an interface between the first cap layer and the top surface of the conductive line, the impurity oxide layer formed from diffused impurity atoms of the seed layer combined with the controllable dose of oxygen.

BRIEF DESCRIPTION OF THE SEVERAL VIEWS OF THE DRAWINGS

Referring to the exemplary drawings wherein like elements are numbered alike in the several Figures:

FIGS. 1(a) through 1(g) are cross sectional views of an exemplary method of forming a barrier layer for metal interconnects through enhanced impurity diffusion, in accordance with an embodiment of the invention, in which:

FIG. 1(a) illustrates an interlevel dielectric (ILD) layer having a plurality of openings patterned therein;

FIG. 1(b) illustrates the formation of a barrier layer over the patterned ILD layer of FIG. 1(a);

FIG. 1(c) illustrates the formation of an impurity seed layer and metal fill over the barrier layer of FIG. 1(b);

FIG. 1(d) illustrates chemical mechanical polishing (CMP) of the metal fill in FIG. 1(c);

FIG. 1(e) illustrates the formation of an oxygen permeable dielectric film over the structure of FIG. 1(d);

FIG. 1(f) illustrates annealing of the structure of FIG. 1(e) in an oxygen containing environment;

FIG. 1(g) illustrates the formation of an oxygen blocking dielectric cap layer on the oxygen permeable dielectric film of FIG. 1(f);

FIGS. 2(a) and 2(b) are cross sectional views of an exemplary method of forming a barrier layer for metal interconnects through enhanced impurity diffusion, in accordance with an embodiment of the invention, in which:

FIG. 2(a) illustrates the formation of an oxygen supplying dielectric film over the structure of FIG. 1(d); and FIG. 2(b) illustrates the formation of an oxygen blocking dielectric cap layer on the oxygen supplying dielectric film of FIG. 2(a).

DETAILED DESCRIPTION

Figure 1C:
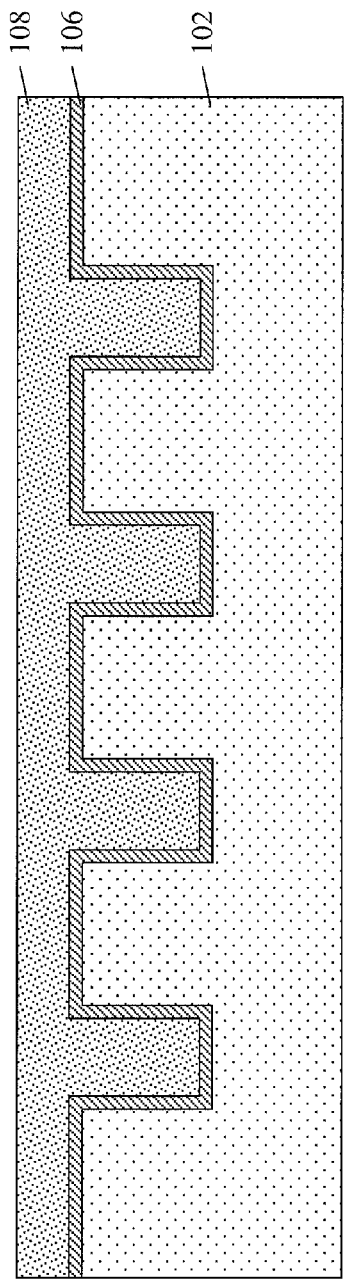

As indicated above, as integrated circuit device dimensions shrink, the electromigration reliability of fine copper interconnects has reached a point such that the required lifetime of the device at operating current densities cannot be obtained without application of additional fabrication techniques to supplement pure Cu interconnects. One such measure is to form a copper alloy seed layer such as copper aluminum (CuAl) or copper manganese (CuMn) prior to deposition of the pure Cu, followed by an annealing step. The alloy impurities (e.g., Mn, Al, etc.) diffuse in copper and segregate at the top surface of the copper lines so as to trap oxygen and create an impurity-rich copper top surface. Since the copper top surface is the most critical location for EM, EM lifetime dramatically improves.

However, a drawback associated with this impurity diffusion technique is the overall increase in the copper line resistance, owing to impurities that do not completely diffuse out to the copper surface. Instead, impurities may remain in the copper matrix, causing a resistance increase of the copper interconnects due to the impurity scattering effect. Specifically, a difficulty lies in reduction of the impurities remaining in the copper matrix. It has been reported that the Mn segregation is enhanced when the copper is heated in an ambient where some trace amounts of oxygen (on the order of parts per million (ppm)) is contained. However, such heating of copper where the surface is exposed to the ambient causes the formation of hillocks and voids in the copper. Thus, any annealing of an integrated circuit device containing copper wiring is typically takes place only after the copper surface is first capped with a nitrogen containing capping layer such as silicon nitride (SiN) and silicon carbon nitride (SiCN), or with a metal capping layer such as cobalt (Co), ruthenium (Ru), and cobalt tungsten phosphide (CoWP), for example.

Accordingly, disclosed herein is a method of forming a barrier layer for metal (e.g., copper) interconnects of an integrated circuit device through enhanced impurity diffusion, by supplying a controlled source of oxygen to the copper surface to enhance the segregation of impurities (e.g., Mn, Al) but without creating hillocks and voids. In one embodiment, after planarization or chemical mechanical polishing (CMP) of copper, the copper top surface is capped with an oxygen permeable dielectric film, such as silicon carbide (SiC) that does not contain nitrogen. The copper is then annealed in an environment that contains oxygen, such as ambient or an oxygen containing gas. During the annealing, the impurities from a copper alloy seed layer (such as Mn and Al) segregate at the copper top surface, being assisted by the oxygen that diffuses through the oxygen permeable cap film to also reach the copper surface and in turn react with the impurities to form an oxide. The diffusion of impurities to the copper top surface continues due to the continuous supply of oxygen through the oxygen permeable dielectric film. As a result, the impurity concentration in the copper matrix of the copper interconnect lines is reduced by about one order of magnitude lower with respect to an annealing process without such an oxygen permeable cap. Further, the resulting resistance of the copper interconnects becomes much closer to that of pure copper, while still providing improved electromigration qualities.

Alternatively, in lieu of annealing in an oxygen containing environment with an oxygen permeable dielectric cap layer, another embodiment includes forming a multistage dielectric cap, where the first layer is actually an oxygen source such as SiON, $SiO_2$, SiCOH, or SiOCNH, rather than a conventional oxygen-free/reducing source such as $Si_3N_4$ or SiCNH. This provides a controllable dose of $O_2$ to the interface. The dose for stoichiometric consumption of all available Mn atoms that had been introduced in the Cu through a doped seed layer can be adjusted. In addition, an excess dose of $O_2$ as compared to Mn could be provided, or a deficient $O_2$ dose relative to Mn atoms may also be provided. Exemplary metal wiring/cap structures may include stacks such as, for example, $Cu/MnO_x/SiO_2/SiCNH$, $Cu/MnO_x/SiCOH/SiCNH$, etc.

Referring initially to FIGS. 1(a) through 1(g) are cross sectional views of an exemplary method of forming a barrier layer for copper interconnects through enhanced impurity diffusion, in accordance with an embodiment of the invention. As shown in FIG. 1(a), an interlevel dielectric (ILD) layer 102 has a plurality of openings 104 patterned therein. The ILD layer 102 may be any dielectric layer as known in the art, such as silicon dioxide, for example, or may be a low-K dielectric layer. As will be understood by one skilled in the art, ILD layer 102 may represent, for example, any wiring level in an integrated circuit device disposed over active devices formed in a semiconductor substrate, such as transistors and the like.

The openings 104 may represent vias, trenches or other such structures in which a conductive metal is to be formed therein, such as done in single or dual damascene processing. In FIG. 1(b), a barrier layer 106 such as tantalum, tantalum nitride, titanium or titanium nitride, for example, is formed over the ILD layer 102 and openings 104 therein. The barrier layer 106 serves as diffusion barrier layer to prevent subsequently formed copper fill from diffusing through the ILD layer 102 during subsequent high temperature annealing processes, as also known in the art.

FIG. 1(c) illustrates the metal fill process of the openings 106, beginning with a copper alloy impurity seed layer, and subsequently copper fill material 108, such as by electroplating or electroless plating. As indicated above, the copper alloy impurity seed layer may be an alloy such as copper aluminum (CuAl) or copper manganese (CuMn) formed prior to deposition of the pure copper. The alloy impurities (e.g., Mn, Al, etc.) diffuse in copper and segregate at the top surface of the copper wiring so as to trap oxygen and create an impurity-rich copper top surface. In addition to manganese or aluminum, it is contemplated that still other impurity atoms including, but not limited to, chromium (Cr) or vanadium (Va) may also be used for the impurity seed layer.

Figure 1D:
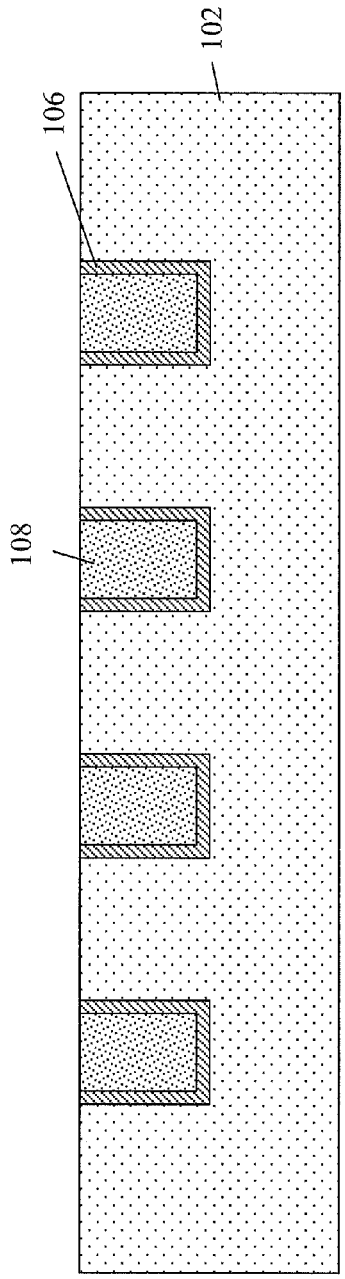
Figure 1G:
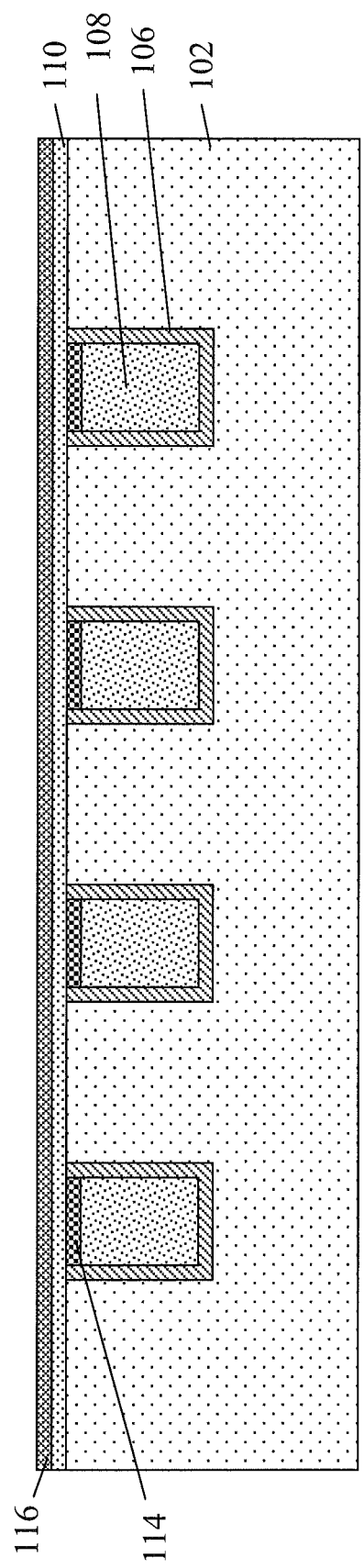

Once the openings are completely overfilled with the copper material 108, a low temperature anneal may be performed to begin to release the impurity atoms in the seed layer, although at this point they do not completely diffuse up through the copper to the top surface. The metal fill is planarized down to the top surface of the ILD layer 102, such as by chemical mechanical polishing (CMP), as shown in FIG. 1(d). In a conventional process, a nitrogen containing dielectric cap material such as SiN or SiCN might be formed at this point. However, in the present embodiment, an oxygen permeable dielectric film 110 is instead formed over the structure as shown in FIG. 1(e). The oxygen permeable dielectric film 110 may be a nitrogen-less material, such as SiC or SiCH, for example, formed by plasma enhanced chemical vapor deposition (PECVD), at a temperature of about 350° C. During the deposition process, the seed layer impurity atoms may begin to diffuse through the bulk of the copper fill.

Referring next to FIG. 1(f), the device is then subjected to an anneal in an oxygen containing environment so that the oxygen (represented by arrows 112 in the figure) may permeate through the film 110 and combine with the impurity atoms. For example, where Mn is the impurity material, manganese oxide 114 is formed at the top surface of the copper lines at the copper/film interface. The diffusion anneal may be performed at a temperature range of about 200° C. to about 450° C., and for a duration of about 10 minutes to about 2 hours. Unlike conventional nitride containing caps, the oxygen permeable dielectric film 110 allows for continued impurity diffusion up through the copper plated region 108, given a continuous supply of oxygen available during the anneal. Once the annealing is complete, an oxygen blocking dielectric cap layer 116 (e.g., SiN, SiCN) is formed on the oxygen permeable dielectric film 110, as shown in FIG. 1(h). In addition to preventing further oxygen penetration, the oxygen blocking dielectric cap layer 116 also protects against further diffusion of copper itself during subsequent high temperature processes as additional levels of wiring are formed.

Another approach to introducing a controlled source of oxygen for diffusion of impurity atoms from a copper alloy seed layer is illustrated in FIGS. 2(a) and 2(b). FIG. 2(a) illustrates a point of processing following CMP as shown in FIG. 1(d). In lieu of the oxygen permeable dielectric cap, a cap layer 210 is formed over the structure, wherein oxygen is a constituent component of the cap layer 210. Here, the oxygen bonding to other elements of the cap layer are relatively weak so as to provide a controllable dose of oxygen for stoichiometric consumption of the dopant atoms that diffuse through the copper. For example, the cap layer 210 may include SiCOH, SiON, or SiOCNH. Alternatively, the deposition of the cap layer 210 may be spiked with $O_2$ or $H_2O$. On the other hand, certain oxygen containing cap layers such as $SiO_2$ may not be as suitable as a controllable oxygen source as the silicon/oxygen bonding is relatively strong, and could inhibit the formation of, for example manganese oxide.

Further, in comparison to the first embodiment of FIG. 1(f), a specific annealing step for diffusion and impurity oxide cap formation may be omitted. Since the controllable oxygen supply is introduced by virtue of the cap layer 210, FIG. 2(b) illustrates the formation of the oxygen blocking dielectric cap layer 116 (e.g., SiN, SiCN) over the oxygen containing cap layer 210. As a result of additional thermal processing during formation of subsequent device layers (generally denoted by 218), the alloy impurity atoms will diffuse through the bulk of the copper lines 108 and combine with oxygen contained in the cap layer 210 to form the impurity oxide interface 114 at the top surface of the copper lines 108.

As will thus be appreciated, the present invention embodiments provide low-resistance, electromigration resistant copper interconnects by providing additional oxygen at the top Cu/cap interface by controllable means, to fully consume and react the alloy species. This is accomplished, for example by $O_2$ or $H_2O$ spiking of the initial dielectric cap deposition, addition of oxygen as a constituent element of the cap, or providing a weakly air-permeable cap. Any of these could be the first layer of a bilayer or multilayer dielectric cap with standard impermeable, non-oxygen containing upper layer(s). The resultant interconnect has a more robust and thickly formed oxidized-alloy self-capping layer, and fully depleted Cu interconnect without residual alloy dopant within the bulk copper. The oxidized alloy is a stoichiometric compound, such as $Al_2O_3$, $MnO_2$, etc., as opposed to a partially oxidized state.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming a barrier layer for metal interconnects of an integrated circuit device, the method comprising:
    forming a conductive line in an insulating layer of the semiconductor device by forming a metal material over a seed layer that is an impurity alloy of the metal;
    forming a first cap layer over a top surface of the conductive line, wherein oxygen is a constituent element of the first cap layer;
    forming a second cap layer over the first cap layer, the second cap layer comprising an oxygen blocking cap layer; and
    following forming the second cap layer, forming subsequent device layers of the integrated circuit device using thermal processing so as to combine diffused impurity atoms of the seed layer with oxygen released by the first cap layer, thereby forming an impurity oxide layer at an interface between the first cap layer and the top surface of the conductive line, wherein the first cap layer provides a controllable oxygen source for combining with the impurity atoms.

2. The method of claim 1, wherein the first cap layer comprises one or more of SiCOH, SiON, and SiOCNH.

3. The method of claim 1, wherein the second cap layer comprises one of more of SiN and SiCN.

4. The method of claim 1, wherein the metal comprises copper (Cu), and the impurity alloy of copper comprises one of more of: manganese (Mn), aluminum (Al), chromium (Cr) and vanadium (Va).

* * * * *